US012302729B2

(12) United States Patent
Meng

(10) Patent No.: US 12,302,729 B2
(45) Date of Patent: May 13, 2025

(54) DISPLAY PANEL INCLUDING DISPLAY REGIONS WITH DIFFERENT PIXEL DENSITIES, DISPLAY DEVICE INCLUDING THE DISPLAY PANEL AND DISPLAY DRIVING METHOD OF THE DISPLAY PANEL

(71) Applicants: Beijing BOE Optoelectronics Technology Co., Ltd., Beijing (CN); BOE Technology Group Co., Ltd., Beijing (CN)

(72) Inventor: Zhaohui Meng, Beijing (CN)

(73) Assignees: Beijing BOE Optoelectronics Technology Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/778,218

(22) PCT Filed: Jul. 27, 2021

(86) PCT No.: PCT/CN2021/108618
§ 371 (c)(1),
(2) Date: May 19, 2022

(87) PCT Pub. No.: WO2023/004575
PCT Pub. Date: Feb. 2, 2023

(65) Prior Publication Data
US 2024/0251625 A1    Jul. 25, 2024

(51) Int. Cl.
*G09G 3/20* (2006.01)
*G09G 3/3208* (2016.01)
(Continued)

(52) U.S. Cl.
CPC ......... *H10K 59/353* (2023.02); *G09G 3/2074* (2013.01); *G09G 3/3208* (2013.01);
(Continued)

(58) Field of Classification Search
CPC .................................................. G09G 3/2074
See application file for complete search history.

(56) References Cited

U.S. PATENT DOCUMENTS

2016/0035265 A1* 2/2016 Park .................... G09G 3/2003
345/694
2018/0366052 A1 12/2018 Shi
(Continued)

FOREIGN PATENT DOCUMENTS

CN       208507679 U    2/2019
CN       110137212 A    8/2019
(Continued)

*Primary Examiner* — William Boddie
*Assistant Examiner* — Andrew B Schnirel
(74) *Attorney, Agent, or Firm* — IPro, PLLC

(57) ABSTRACT

The present disclosure provides a display panel, a display device and a display driving method. The display panel includes a first display region and a second display region each including a plurality of pixel repeat units, each pixel repeat unit includes two pixel groups in adjacent pixel rows, and the two pixel groups in a same pixel repeat unit are closest to each other relative to two pixel groups in different pixel repeat units. Each pixel group includes a plurality of sub-pixels in different colors, and the sub-pixels in different colors are arranged in different modes along a pixel row direction in the two pixel groups in a same pixel repeat unit.

18 Claims, 4 Drawing Sheets

(51) Int. Cl.
*H10K 59/35* (2023.01)
*H10K 59/90* (2023.01)

(52) U.S. Cl.
CPC .............. *G09G 2300/0413* (2013.01); *G09G 2300/0452* (2013.01); *G09G 2370/00* (2013.01); *H10K 59/90* (2023.02)

(56) References Cited

U.S. PATENT DOCUMENTS

| | | | |
|---|---|---|---|
| 2020/0168674 A1 | 5/2020 | Tan et al. | |
| 2020/0203450 A1 | 6/2020 | Lou et al. | |
| 2020/0212125 A1* | 7/2020 | Liu | H10K 59/352 |
| 2020/0312832 A1* | 10/2020 | Chi | H10K 59/131 |
| 2021/0020664 A1 | 1/2021 | Tan | |
| 2021/0035484 A1* | 2/2021 | Matsueda | G09G 3/2003 |
| 2021/0335297 A1 | 10/2021 | Huangfu et al. | |
| 2021/0407369 A1 | 12/2021 | Li | |
| 2022/0028311 A1* | 1/2022 | Matsueda | G09G 3/3233 |
| 2022/0037422 A1* | 2/2022 | Zhang | H10K 59/88 |

FOREIGN PATENT DOCUMENTS

| | | |
|---|---|---|
| CN | 110444125 A | 11/2019 |
| CN | 110599954 A | 12/2019 |
| CN | 110603578 A | 12/2019 |
| CN | 110838505 A | 2/2020 |
| CN | 110945582 A | 3/2020 |
| CN | 111326121 A | 6/2020 |
| CN | 112313802 A | 2/2021 |
| CN | 112489584 A | 3/2021 |

* cited by examiner though the display region corresponding to the under-screen camera module is transparent to allow external ambient light to pass therethrough, so as to facilitate the image collection by the camera module.

DISPLAY PANEL INCLUDING DISPLAY REGIONS WITH DIFFERENT PIXEL DENSITIES, DISPLAY DEVICE INCLUDING THE DISPLAY PANEL AND DISPLAY DRIVING METHOD OF THE DISPLAY PANEL

CROSS-REFERENCE TO RELATED APPLICATION

This application is the U.S. national phase of PCT Application No. PCT/CN2021/108618 filed on Jul. 27, 2021, which is incorporated herein by reference in its entirety.

TECHNICAL FIELD

The present disclosure relates to the field of display technology, in particular to a display panel, a display device, and a display driving method.

BACKGROUND

Most of modern consumer electronic devices are equipped with Liquid Crystal Display (LCD) panels or Organic Light-Emitting Diode (OLED) display panels as man-machine interfaces. Each display panel includes a pixel element array. Usually, based on electronic data generated in accordance with an original image, the image is divided into regions with a same quantity of pixels, and the total quantity of pixels is equal to the quantity of pixel elements on the display panel. Along with an increase in the demand on display screens, especially mobile phone display screens, there is such a trend to provide a current display panel with an under-screen camera module.

For the display panel with the under-screen camera module, a display region corresponding to the under-screen camera module is capable of displaying an image when the display panel is in a display state, so as to provide a full-screen display effect. When the display panel is not in the display state, the display region corresponding to the under-screen camera module is transparent to allow external ambient light to pass therethrough, so as to facilitate the image collection by the camera module.

At present, in order to enable the display region corresponding to the under-screen camera module to satisfy the above-mentioned display effects, the quantity of pixels is usually reduced on the display region. However, based on this structure, a density of pixel units at the display region is less than a density of pixel units at a normal display region. At this time, a resolution at the display region is less than a resolution at the normal display region, thereby the display effect may be adversely affected.

SUMMARY

An object of the present disclosure is to provide a display panel, a display device and a display driving method, so as to ensure a display effect while satisfying the requirement on a light transmittance at a display region corresponding to an under-screen camera module.

In one aspect, the present disclosure provides in some embodiments a display panel, including a first display region and a second display region. The first display region is provided with a first pixel density, and the second display region is provided with a second pixel density smaller than the first pixel density. Each of the first display region and the second display region includes a plurality of pixel repeat units, each pixel repeat unit includes two pixel groups in adjacent pixel rows, and the two pixel groups in a same pixel repeat unit are closest to each other relative to two pixel groups in different pixel repeat units. Each pixel group includes a plurality of sub-pixels in different colors, the sub-pixels in different colors are arranged in different modes along a pixel row direction in the two pixel groups in a same pixel repeat unit, a sub-pixel in a first color and a sub-pixel in a third color in a first pixel group are adjacent to a sub-pixel in a second color in a second pixel group, and a sub-pixel in the first color and a sub-pixel in the second color in the second pixel group are adjacent to a sub-pixel in the third color in the first pixel group.

In a possible embodiment of the present disclosure, a second pixel group in the two pixel groups is offset by a half of a width of one sub-pixel in a first direction relative to a first pixel group, and the first direction points toward one edge of a pixel row.

In a possible embodiment of the present disclosure, the sub-pixels have a same width in the pixel row direction, a sub-pixel in the first color in a second pixel group in the two pixel groups is offset by 1.5 times of a width of one sub-pixel in a first direction relative to a sub-pixel in the first color in a first pixel group, and the first direction points toward one edge of a pixel row.

In a possible embodiment of the present disclosure, the sub-pixel in the second color in the second color in the second pixel group in the two pixel groups is offset by 1.5 times of the width of one sub-pixel in a second direction relative to a sub-pixel in the second color in the first pixel group, and the second direction points toward the other edge of the pixel row.

In a possible embodiment of the present disclosure, each pixel group includes, in the pixel row direction, a sub-pixel in the first color, a sub-pixel in the second color and two sub-pixels in the third color, a total light-emission area of the sub-pixels in the third color is equal to a light-emission area of the sub-pixel in the first color, and the light-emission area of the sub-pixel in the first color is equal to a light-emission area of the sub-pixel in the second color.

In a possible embodiment of the present disclosure, a first pixel group in the two pixel groups includes, in the pixel row direction, a sub-pixel in the first color, two second sub-pixels in the third color arranged in a pixel column direction, and a sub-pixel in the second color, and a second pixel group includes, in the pixel row direction, a sub-pixel in the second color, a sub-pixel in the first color and two sub-pixels in the third color arranged in the pixel column direction.

In a possible embodiment of the present disclosure, each pixel repeat unit is spaced part from an adjacent pixel repeat unit by a space for accommodating at least one pixel repeat unit in both the pixel row direction and the pixel column direction at the second display region.

In a possible embodiment of the present disclosure, the first color is blue, the second color is red, and the third color is green.

In another aspect, the present disclosure provides in some embodiments a display device including the above-mentioned display panel.

In yet another aspect, the present disclosure provides in some embodiments a display driving method for the above-mentioned display panel, including: receiving a row scanning signal on a target row when an image is inputted; and inputting a data signal to a plurality of driving pixel units on the target row sequentially in response to the row scanning signal, so as to energize the sub-pixels in each driving pixel unit to form a plurality of dummy pixel units. Each driving pixel unit includes a first part of sub-pixels in a first pixel group in one pixel repeat unit and a second part of sub-pixels in a second pixel group in the pixel repeat unit, the first part of sub-pixels and the second part of sub-pixels include sub-pixels in different colors, and the first pixel group or the second pixel group is located in the target row.

In a possible embodiment of the present disclosure, in the plurality of driving pixel units to which the data signal is inputted, the sub-pixels in every two adjacent pixel driving units are located in a same pixel repeat unit.

In a possible embodiment of the present disclosure, when the first pixel group in the two pixel groups includes, in a pixel row direction, a sub-pixel in a first color, two sub-pixels in a third colors arranged in a pixel column direction, and a sub-pixel in a second color, and the second pixel group includes, in the pixel row direction, a sub-pixel in the second color, a sub-pixel in the first color and two sub-pixels in the third color arranged in the pixel column direction, the target row i is an odd-numbered row. When the sub-pixels in the driving pixel unit are energized and a first dummy pixel unit in two adjacent dummy pixel units in an $i^{th}$ row is in a $j^{th}$ column, the energized sub-pixels include a sub-pixel in the second color in the $i^{th}$ row and a $(j+1)^{th}$ column, a sub-pixel in the first color in the $i^{th}$ row and the $j^{th}$ column, a sub-pixel in the third color in an $(i-1)^{th}$ row and a $(j-1)^{th}$ column, and a sub-pixel in the third color in the $i^{th}$ row and the $j^{th}$ column. When a second dummy pixel unit is in the $i^{th}$ row and the $j^{th}$ column, the energized sub-pixels include a sub-pixel in the second color in the $i^{th}$ row and the $(j+1)^{th}$ column, a sub-pixel in the first color in an $(i+1)^{th}$ row and the $(j+_1)^{th}$ column, a sub-pixel in the third color in the $(i-1)^{th}$ row and the $(j-1)^{th}$ column, and a sub-pixel in the third color in the $i^{th}$ row and the $j^{th}$ column.

In a possible embodiment of the present disclosure, when the target row i is an even-numbered row, the sub-pixels in the driving pixel unit are energized, and the first dummy pixel unit in the two adjacent dummy pixel units in the $i^{th}$ row is in the $j^{th}$ column, the energized sub-pixels include a sub-pixel in the second color in the $i^{th}$ row and the $j^{th}$ column, a sub-pixel in the first color in the $i^{th}$ row and the $j^{th}$ column, a sub-pixel in the third color in an $(i-_2)^{th}$ row and the $j^{th}$ column, and a sub-pixel in the third color in the $(i-1)^{th}$ row and the $j^{th}$ column. When the second dummy pixel unit is in the $i^{th}$ row and the $j^{th}$ column, the energized sub-pixels include a sub-pixel in the second color in the $i^{th}$ row and the $j^{th}$ column, a sub-pixel in the first color in the $(i+1)^{th}$ row and the $(j-1)^{th}$ column, a sub-pixel in the third color in the $i^{th}$ row and the $(j+1)^{th}$ column, and a sub-pixel in the third color in the $(i+1)^{th}$ row and the $(j+1)^{th}$ column.

In still yet another aspect, the present disclosure provides in some embodiments a display driving device for the above-mentioned display panel, including: a reception module configured to receive a row scanning signal on a target row when an image is inputted; and a response module configured to input a data signal to a plurality of driving pixel units on the target row sequentially in response to the row scanning signal, so as to energize the sub-pixels in each driving pixel unit to form a plurality of dummy pixel units. Each driving pixel unit includes a first part of sub-pixels in a first pixel group in one pixel repeat unit and a second part of sub-pixels in a second pixel group in the pixel repeat unit, the first part of sub-pixels and the second part of sub-pixels include sub-pixels in different colors, and the first pixel group or the second pixel group is located in the target row.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments.

In the related art, for a display panel with an under-screen camera, in order to meet the requirement on light transmittance, the quantity of pixels is reduced at a display region corresponding to the camera as compared with a normal display region. At this time, a resolution at the display region corresponding to the camera is smaller than a resolution at the normal display region, and thereby a display effect will be adversely affected. An object of the present disclosure is to provide a display panel and a display driving method, so as to, through designing a pixel structure at the display region corresponding to the camera and providing a corresponding Sub-Pixel Rendering (SPR) technology, provide a display effect at the display region approaching to that at the normal display region while ensuring a maximum light transmittance at the display region.

Figure 1:
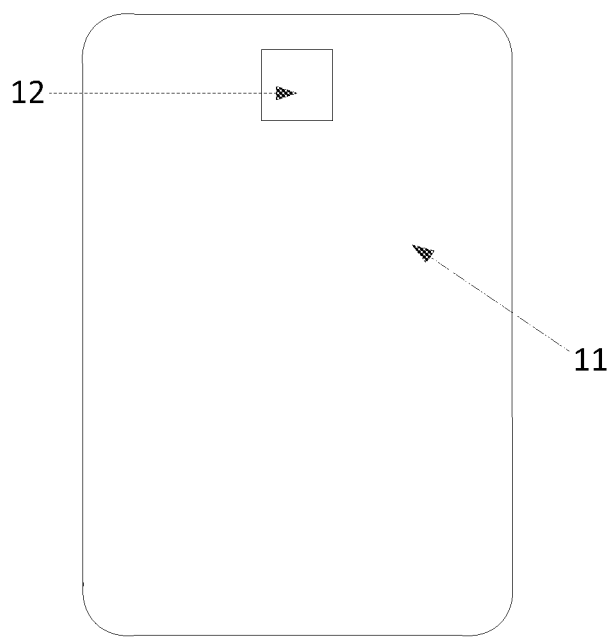
FIG. 1 is a planar view of a display panel according to one embodiment of the present disclosure.

As shown in FIG. 1, the present disclosure provides in some embodiments a display panel, which includes a first display region 11 and a second display region 12 adjacent to each other.

The second display region 12 is formed as a transparent display region. When the display panel is mounted on an electronic device, a photosensitive element such as a camera is provided in an interior of the electronic device at a position corresponding to the second display region 12, so as to collect images through the second display region 12, i.e., an under-screen camera structure is formed.

In a possible embodiment of the present disclosure, the first display region 11 is arranged in such a manner as to surround the second display region 12, and the first display region 11 and the second display region 12 are combined to form an entire display region of the display panel. In a possible embodiment of the present disclosure, the entire display region of the display panel is a transparent display region, or only the second display region 12 is a transparent display region, so as to facilitate the image collection by the under-screen camera. In a possible embodiment of the present disclosure, the display panel is an OLED display panel.

Figure 2:
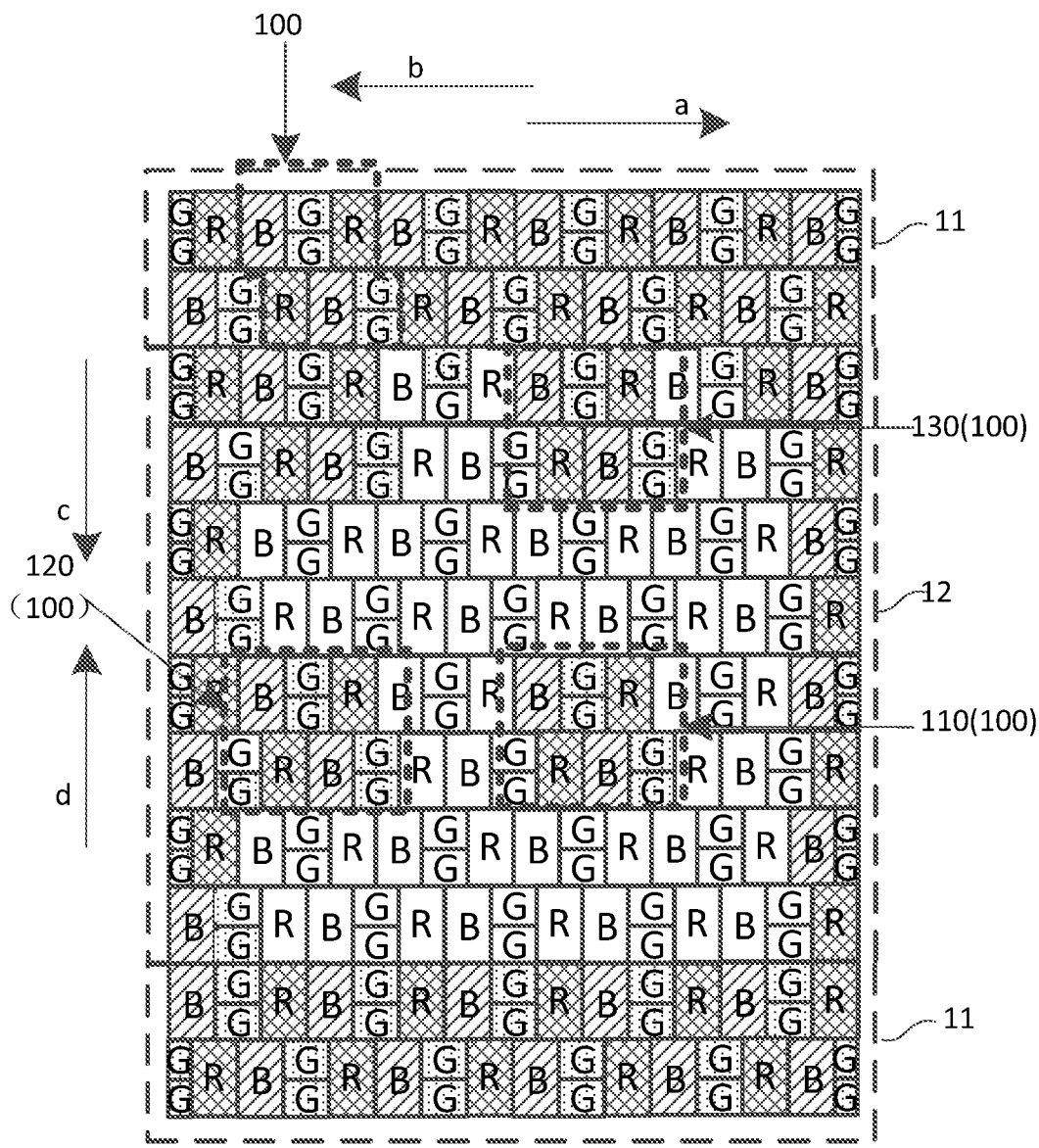
FIG. 2 is a schematic view showing a pixel array in the display panel according to one embodiment of the present disclosure.

As shown in FIG. 2, the first display region 11 includes a plurality of pixel repeat units 100 sequentially coupled to each other and the second display region 12 includes a plurality of pixel repeat units 100 spaced apart from each other. The first display region 11 is provided with a first pixel density, the second display region 12 is provided with a second pixel density, and the first pixel density is greater than the second pixel density. Through reducing the pixel distribution density at the second display region 12, it is able to increase a light transmittance at the second display region 12, thereby to meet the requirement on the image collection by the under-screen camera.

It should be appreciated that, in FIG. 2, each hatched block at the second display region is an actual sub-pixel, and a plurality of pixel repeat units 100 is formed. Each blank block between the pixel repeat units 110 is not actual sub-pixel, and it is marked with R, G or B so as to show a positional relationship among the pixel repeat units 110.

Figure 3:
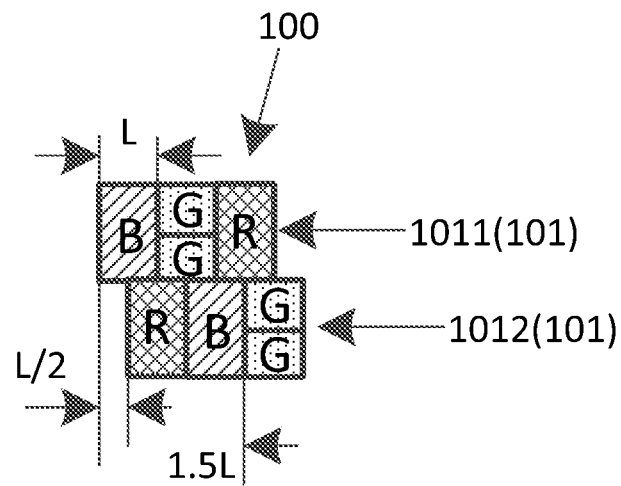
FIG. 3 a topical schematic view showing the pixel array in FIG. 2.

As shown in FIG. 2 in conjunction with FIG. 3, each of the first display region 11 and the second display region 12 includes a plurality of pixel repeat units 100, each pixel repeat unit 100 includes two pixel groups 101 located in adjacent pixel rows, and the two pixel groups 101 in a same pixel repeat unit 100 are closest to each other relative to two pixel groups 101 in different pixel repeat units 100.

Each pixel group 101 includes a plurality of sub-pixels in different colors, the sub-pixels in different colors are arranged in different modes along a pixel row direction in the two pixel groups 101 in a same pixel repeat unit 100, a sub-pixel in a first color and a sub-pixel in a third color in a first pixel group are adjacent to a sub-pixel in a second color in a second pixel group, and a sub-pixel in the first color and a sub-pixel in the second color in the second pixel group are adjacent to a sub-pixel in the third color in the first pixel group.

According to the display panel in the embodiments of the present disclosure, each pixel repeat unit 100 includes two pixel groups 101 located in adjacent rows. When the display driving is performed, the sub-pixels in different pixel groups in each pixel repeat unit 100 are shared to determine a corresponding driving pixel unit, and then a dummy pixel unit is formed through an SPR driving algorithm. In this way, it is able to increase a resolution at the display region corresponding to the camera while ensuring a maximum light transmittance at the display region, and provide a display effect at the second display region approaching to that at a normal display region (the first display region).

In addition, in the embodiments of the present disclosure, in two pixel groups, the sub-pixel in the first color and the sub-pixel in the third color in the first pixel group are adjacent to the sub-pixel in the second color in the second pixel group, and the sub-pixel in the first color and the sub-pixel in the second color in the second pixel group are adjacent to the sub-pixel in the third color in the first pixel group, such that the sub-pixel in one color in the first pixel group is adjacent to the sub-pixel in a different color in the second pixel group. Hence, when the dummy pixel unit is formed through the SPR driving algorithm, it is able to share the sub-pixels in different pixel groups in each pixel repeat unit 100, thereby to improve the resolution at the display region corresponding to the camera.

In a possible embodiment of the present disclosure, as shown in FIGS. 2 and 3, for two pixel groups 101 in the pixel repeat unit 100, a first pixel group 1011 includes a blue B sub-pixel, a green G sub-pixel and a red R sub-pixel arranged sequentially, and a second pixel group 1012 includes a red R sub-pixel, a blue B sub-pixel and a green G sub-pixel arranged sequentially. The blue B sub-pixel and the green G sub-pixel in the first pixel group 1011 are adjacent to the red R sub-pixel in the second pixel group 1012, and the green G sub-pixel and the red R sub-pixel in the first pixel group 1011 are adjacent to the blue B sub-pixel in the second pixel group 1012. Identically, the red R sub-pixel and the blue sub-pixel in the second pixel group 1012 are adjacent to the green G sub-pixel in the first pixel group 1011, and the blue B sub-pixel and the green G sub-pixel in the second pixel group 1012 are adjacent to the red R sub-pixel in the first pixel group 1011.

In the embodiments of the present disclosure, as shown in FIG. 3, for two pixel groups 101 in the pixel repeat unit 100, the second pixel group 1012 is offset by a half of a width L of one sub-pixel, i.e., L/2, in a row extension direction a (a first direction) relative to the first pixel group 1011.

It should be appreciated that, in the embodiments of the present disclosure, the row extension direction a is defined as a horizontal direction from left to right when an image is displayed on the display panel, that is, a direction pointing toward one edge of the pixel row of the display panel; the. A direction b is a direction opposite to the row extension direction a, that is, a second direction. A column extension direction c is defined as a vertical direction from top to bottom when an image is displayed on the display panel, and similarly, a direction d is a direction opposite to the column extension direction c.

In a possible embodiment of the present disclosure, in the two pixel groups 101, the sub-pixels have a same width in the pixel row direction, and a sub-pixel in the first color in the second pixel group 1012 is offset by 1.5 times of the width L of one sub-pixel in the row extension direction a relative to a sub-pixel in the first color in the first pixel group 1011.

Further, a sub-pixel in the second color in the second pixel group 1012 is offset by 1.5 times of the width L of one sub-pixel in the direction b relative to a sub-pixel in the second color in the first pixel group 1011.

Specifically, as shown in FIG. 3, when the two pixel groups 101 include sub-pixels in blue, red and green, the first color is blue, the second color is red and the third color is green, the sub-pixel in the first color (blue) in the second pixel group 1012 is offset by 1.5 times of the width L of one sub-pixel along the row extension direction a relative to the sub-pixel in the first color (blue) in the first pixel group 1011.

Further, in the two pixel groups 101, the sub-pixel in the second color (red) in the second pixel group 1012 is offset by 1.5 times of the width L of one sub-pixel along the direction b relative to the sub-pixel in the second color (red) in the first pixel group 1011.

Based on the above, the sub-pixel in the third color (green) in the third pixel group 1012 is offset by 1.5 times of the width L of one sub-pixel along the row extension direction a relative to the sub-pixel in the third color (green) in the first pixel group 1011.

In the embodiments of the present disclosure, as shown in FIGS. 2 and 3, each pixel group 101 includes a sub-pixel in the first color, a sub-pixel in the second color, and two sub-pixels in the third color arranged along the column extension direction (along a pixel column), a total light-emission area of the two sub-pixels in the third color is equal to that of the sub-pixel in the first color, and the light-emission area of the sub-pixel in the first color is equal to that of the sub-pixel in the second color.

In a possible embodiment of the present disclosure, as shown in FIGS. 2 and 3, the first pixel group 1011 of the two pixel groups 101 includes, along the row extension direction a, a sub-pixel in the first color, two sub-pixels in the third color arranged along the pixel column direction, and a sub-pixel in the second color, and the second pixel group 1012 includes, along the row extension direction a, a sub-pixel in the second color, a sub-pixel in the first color, and two sub-pixels in the third color arranged along the pixel column direction.

In a possible embodiment of the present disclosure, the first color is blue, the second color is red, and the third color is green.

Specifically, as shown in FIGS. 2 and 3, in one pixel repeat unit 100, the first pixel group 1011 includes, in the row extension direction a, a blue sub-pixel, two green sub-pixels arranged along the column direction, and a red sub-pixel, and the second pixel group 1012 includes, in the row extension direction a, a red sub-pixel, a blue sub-pixel, and two green sub-pixels arranged in the column direction.

It should be appreciated that, in the first pixel group 1011 and the second pixel group 1012 in adjacent rows, the arrangement of the sub-pixels in different colors is not limited to that mentioned hereinabove, as long as the sub-pixels in different colors in the two pixel groups 101 are arranged differently, the sub-pixel in the first color in the second pixel group 1012 is offset by 1.5 times of the width of one sub-pixel in the row extension direction relative to the sub-pixel in the first color in the first pixel group 1011, and the sub-pixel in the second color in the second pixel group 1012 is offset by 1.5 times of the width of one sub-pixel in the direction opposite to the row extension direction relative to the sub-pixel in the second color in the first pixel group 1011. At this time, in the pixel repeat unit 100, the sub-pixel in one color in the first pixel group is arranged adjacent to the sub-pixel in a different color in the second pixel group.

Further, each pixel repeat unit 100 is spaced part from an adjacent pixel repeat unit 100 by a space for accommodating at least one pixel repeat unit 100 in both the pixel row direction a and the pixel column direction c at the second display region 12.

Specifically, as shown in FIG. 2, along the row extension direction a, a first pixel repeat unit 110 and a second pixel repeat unit 120 are spaced apart from each other by a space for accommodating at least one pixel repeat unit 100, namely, by a width of one pixel repeat unit in the row extension direction a. Along the column extension direction b, the first pixel repeat unit 110 and a third pixel repeat unit 130 are spaced apart from each other by a space for accommodating at least one pixel repeat unit 100, namely, by a width of one pixel repeat unit 100 in the column extension direction b, particularly a width of two pixel rows.

Based on the above structure, the display panel includes the plurality of pixel repeat units 100. At the first display region 11, the plurality of pixel repeat units 1001 are sequentially coupled to each other in both the row extension direction and the column extension direction. At the second display region 12, the plurality of pixel repeat units 100 are spaced apart from each other in both the row extension direction and the column extension direction. In addition, at the first display region 11 and the second display region 12, each pixel repeat unit 100 includes two pixel groups 101 in adjacent two pixel rows.

In a possible embodiment of the present disclosure, in each pixel repeat unit 100, when the first color is blue, the second color is red and the third color is green, based on the above arrangement mode, a distance between a center of the red sub-pixel in the first pixel group 1011 and a center of the red sub-pixel in the second pixel group 1012 is between 28 μm and 32 μm in the row extension direction, e.g., 30 μm, and a distance between the centers is between 30 μm and 36 μm, e.g., 34 μm in the column extension direction. A distance between a center of the blue sub-pixel in the first pixel group 1011 and a center of the blue sub-pixel in the second pixel group 1012 is between 28 μm and 32 μm in the row extension direction, e.g., 30 μm, and a distance between the centers is between 40 μm and 45 μm in the column extension direction, e.g., 42 μm.

In a possible embodiment of the present disclosure, in the plurality of pixel repeat units 100, each pixel group 101 includes four sub-pixels in red R, green G, green G, and blue B. A light-emission area of the red sub-pixel is equal to a light-emission area of the blue sub-pixel, two green sub-pixels are arranged along the column extension direction, and a total light-emission area of the two green sub-pixels is equal to the light-emission area of the red sub-pixel and the light-emission area of the blue sub-pixel.

Based on the above-mentioned arrangement mode of the sub-pixels in the pixel repeat unit 100, the dummy pixel unit is formed through the SPR driving algorithm, the G sub-pixel in each dummy pixel unit is represented as a g signal in the red, green and blue pixels, and the R and B sub-pixels are represented as an r signal and a g signal respectively in the adjacent red, green and blue pixels through an algorithm shared by left and right dummy pixels in a same row (i.e., an algorithm shared by the sub-pixels).

In a possible embodiment of the present disclosure, during the display driving, in one pixel group 101, an upper G sub-pixel of the two G sub-pixels arranged in the column extension direction is configured to address the pixels in a previous row and a lower G sub-pixel is configured to address the pixels in a current row.

Specifically, during the display driving, upon the receipt of a row scanning signal in a target row, in response to the row scanning signal, some sub-pixels in the first pixel group 1011 and the second pixel group 1012 in each pixel repeat unit 100 are shared so as to sequentially energize a plurality of driving pixel units in the target row, each driving pixel unit includes a first part of sub-pixels in the first pixel group 1011 in one pixel repeat unit 100 and a second part of sub-pixels in the second pixel group 1012 in the pixel repeat unit 100, and the first pixel group 1011 or the second pixel group 1012 is located in the target row.

In a possible embodiment of the present disclosure, the first part of sub-pixels and the second part of sub-pixels in each driving pixel unit include the sub-pixels in different colors.

It should be appreciated that, in the first pixel group 1011 and the second pixel group 1012, the plurality of sub-pixels is coupled to different driving signal lines, that is, the plurality of sub-pixels in a same pixel group belong to different pixel addressing rows.

Specifically, as shown in FIGS. 2 to 5, upon the receipt of the row scanning signal in the target row, a data signal is sequentially inputted to a plurality of driving pixel units 200 arranged along a target row extension direction a. The sub-pixels in every two adjacent driving pixel units 200 are located in the same pixel repeat unit 100.

In a possible embodiment of the present disclosure, when the target row is an odd-numbered row, in every two adjacent driving pixel units 200, a first driving pixel unit 201 includes the sub-pixel in the first color and the sub-pixel in the third color in the first pixel group 1011 and the sub-pixel in the second color in the second pixel group 1012, and the second driving pixel unit 202 includes the sub-pixel in the third color and the sub-pixel in the second color in the first pixel group 1011 and the sub-pixel in the first color in the second pixel group 1012.

In the first pixel group 1011, the sub-pixel in the first color, the sub-pixel in the third color and the sub-pixel in the second color are sequentially arranged along the row extension direction. In the second pixel group 1012, the sub-pixel in the second color, the sub-pixel in the first color, and the sub-pixel in the third color are sequentially arranged.

Figure 4:
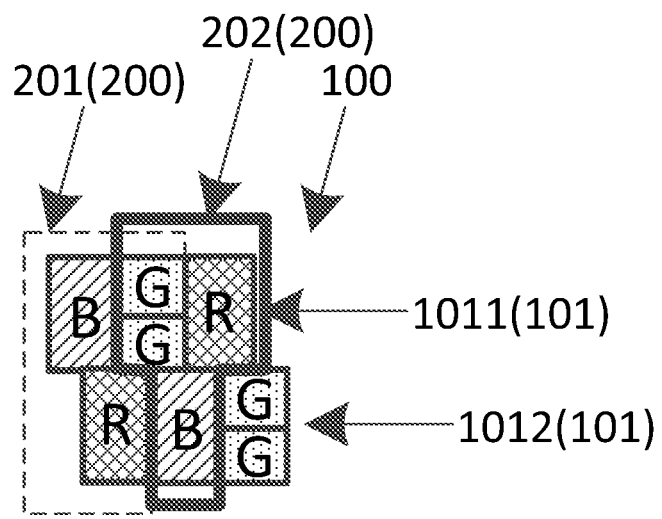
FIG. 4 is another topical schematic view showing the pixel array in FIG. 2.

In the case that the first color is blue, the second color is red and the third color is green in the first pixel group 1011 and the second pixel group 1012, as shown in FIG. 4, when the data signal is inputted to the first driving pixel unit 201, the first driving pixel unit 201 includes the blue sub-pixel and the green sub-pixel in the first pixel group 1011 in the target row (the odd-numbered row, namely, a row where the first pixel group 1011 is located), and the red sub-pixel in the second pixel group 1012 (in an even-numbered row) is shared. Based on the data signal, each driving pixel unit 200 forms a dummy pixel unit in red, green or blue.

Specifically, when the target row, i.e., an $i^{th}$ row, is the odd-numbered row, the dummy pixel unit formed through the first driving pixel unit 201 is expressed as (namely, when the target row, i.e., the $i^{th}$ row, is the odd-numbered row, a first dummy pixel unit formed through the first driving pixel unit 201 is expressed as) $R_{i,j}=r_{i,j+1}$; $B_{i,j}=b_{i,j}$;

$$G_{i,j} = \left(\frac{g_{i-1,j-1}^{\gamma} + g_{i,j}^{\gamma}}{2}\right)^{\frac{1}{\gamma}},$$

where $G_{i,j}$, $R_{i,j}$, $B_{i,j}$ are grayscale values of a G sub-pixel, a B sub-pixel and an R sub-pixel of a dummy pixel unit in the $i^{th}$ row and $j^{th}$ column, $r_{i,j+1}$ is a grayscale value of an R sub-pixel in the $i^{th}$ row and a $(j+1)^{th}$ column, $b_{i,j}$ is a grayscale value of a B sub-pixel in the $i^{th}$ row and the $j^{th}$ column, $g_{i-1,j-1}$ is a grayscale value of a G sub-pixel in the $i^{th}$ row and a $(j-1)^{th}$ column, $g_{i,j}$ is a grayscale value of a G sub-pixel in the $i^{th}$ row and the $j^{th}$ column, and $\gamma$ is a preset grayscale function.

In the case that the first color is blue, the second color is red and the third color is green in the first pixel group 1011 and the second pixel group 1012, as shown in FIG. 4, when the data signal is inputted to the second driving pixel unit 202, the second driving pixel unit 202 includes the green sub-pixel and the red sub-pixel in the first pixel group 1011 in the target row (the odd-numbered row, namely, a row where the first pixel group 1011 is located), and the blue sub-pixel in the second pixel group 1012 (in the even-numbered row) is shared.

Specifically, when the target row, i.e., an $i^{th}$ row, is the odd-numbered row, the dummy pixel unit formed through the second driving pixel unit 202 is expressed as (namely, when the target row, i.e., the $i^{th}$ row, is the odd-numbered row, a second dummy pixel unit formed through the second driving pixel unit 202 is expressed as) $R_{i,j}=r_{i,j+1}$; $B_{i,j}=b_{i+1,j+1}$;

$$G_{i,j} = \left(\frac{g_{i-1,j-1}^{\gamma} + g_{i,j}^{\gamma}}{2}\right)^{\frac{1}{\gamma}},$$

where $G_{i,j}$, $R_{i,j}$, $B_{i,j}$ are grayscale values of a G sub-pixel, a B sub-pixel and an R sub-pixel of a dummy pixel unit in the $i^{th}$ row and a $j^{th}$ column, $r_{i,j+1}$ is a grayscale value of an R sub-pixel in the $i^{th}$ row and a $(j+1)^{th}$ column, $b_{i+1,j+1}$ is a grayscale value of a B sub-pixel in an $(i+1)^{th}$ row and the $(j+1)^{th}$ column, $g_{i-1,j-1}$ is a grayscale value of a G sub-pixel in the $i^{th}$ row and a $(j-1)^{th}$ column, $g_{i,j}$ is a grayscale value of a G sub-pixel in the $i^{th}$ row and the $j^{th}$ column, and $\gamma$ is a preset grayscale function.

Figure 5:
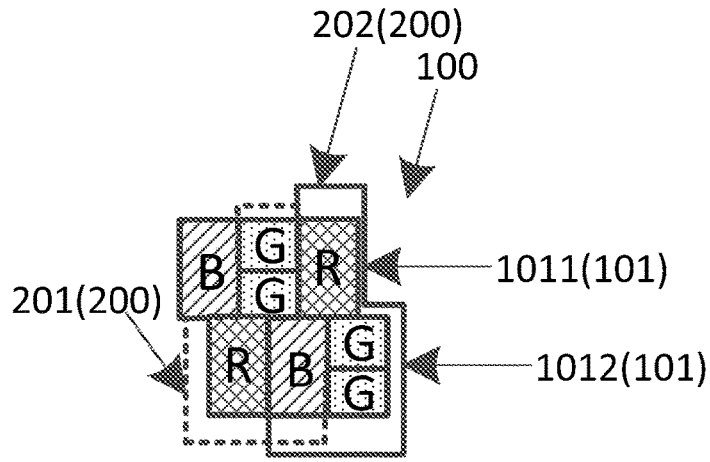
FIG. 5 is yet another topical schematic view showing the pixel array in FIG. 2.

In a possible embodiment of the present disclosure, as shown in FIG. 5, when the target row is the even-numbered row, in every two adjacent driving pixel units 200, the first driving pixel unit 201 includes the sub-pixel in the third color in the first pixel group 1011 and the sub-pixel in the second color and the sub-pixel in the first color in the second pixel group 1012, and the second driving pixel unit 202 includes the sub-pixel in the second color in the first pixel group 1011 and the sub-pixel in the first color and the sub-pixel in the third color in the second pixel group 1012.

In the case that the first color is blue, the second color is red and the third color is green in the first pixel group 1011 and the second pixel group 1012, when the data signal is inputted to the first driving pixel unit 201, the first driving pixel unit 201 includes the red sub-pixel and the blue sub-pixel in the target row (the even-numbered row, namely, a row where the second pixel group 1012 is located), and also the green sub-pixel of the first pixel group 1011 (in the odd-numbered row).

Specifically, when the target row, i.e., an $i^{th}$ row, is the even-numbered row, the dummy pixel unit formed through the first driving pixel unit 201 is expressed as (namely, when the target row, i.e., the $i^{th}$ row, is the even-numbered row, a first dummy pixel unit formed through the first driving pixel unit 201 is expressed as) $R_{i,j}=r_{i,j}$; $B_{i,j}=b_{i,j}$;

$$G_{i,j} = \left(\frac{g_{i-2,j}^{\gamma} + g_{i-1,j}^{\gamma}}{2}\right)^{\frac{1}{\gamma}},$$

where $G_{i,j}$, $R_{i,j}$, $B_{i,j}$ are grayscale values of a G sub-pixel, a B sub-pixel and an R sub-pixel of the first dummy pixel unit in the $i^{th}$ row and a $j^{th}$ column, $r_{i,j}$ is a grayscale value of an R sub-pixel in the $i^{th}$ row and the $j^{th}$ column, $b_{i,j}$ is a grayscale value of a B sub-pixel in the $i^{th}$ row and the $j^{th}$ column, $g_{i-2,j}$ is a grayscale value of a G sub-pixel in an $(i-2)^{th}$ row and the $j^{th}$ column, $g_{i-1,j}$ is a grayscale value of a G sub-pixel in an $(i-1)^{th}$ row and the $j^{th}$ column, and $\gamma$ is a preset grayscale function.

In the case that the first color is blue, the second color is red and the third color is green in the first pixel group 1011 and the second pixel group 1012, when the data signal is inputted to the second driving pixel unit 202, the second driving pixel unit 201 includes the blue sub-pixel and the green sub-pixel in the target row (the even-numbered row, namely, a row where the second pixel group 1012 is located), and also the red sub-pixel of the first pixel group 1011 (in the odd-numbered row).

Specifically, when the target row, i.e., an $i^{th}$ row, is the even-numbered row, the dummy pixel unit formed through the first driving pixel unit 201 is expressed as (namely, when the target row, i.e., the $i^{th}$ row, is the even-numbered row, the second dummy pixel unit formed through the second driving pixel unit 202 is expressed as) $R_{i,j}=r_{i,j}$; $B_{i,j}=b_{i+1,j-1}$;

$$G_{i,j} = \left(\frac{g_{i,j+1}^{\gamma} + g_{i+1,j+1}^{\gamma}}{2}\right)^{\frac{1}{\gamma}},$$

where $G_{i,j}$, $R_{i,j}$, $B_{i,j}$ are grayscale values of a G sub-pixel, a B sub-pixel and an R sub-pixel of a dummy pixel unit in the $i^{th}$ row and a $j^{th}$ column, $r_{i,j}$ is a grayscale value of an R sub-pixel in the $i^{th}$ row and the $j^{th}$ column, $b_{i+1,j-1}$ is a grayscale value of a B sub-pixel in an $(i+1)^{th}$ row and a $(j-1)^{th}$ column, $g_{i,j+1}$ is a grayscale value of a G sub-pixel in the $i^{th}$ row and a $(j+1)^{th}$ column, $g_{i+1,j+1}$ is a grayscale value of a G sub-pixel in the $(i+1)^{th}$ row and the $(j+1)^{th}$ column, and $\gamma$ is a preset grayscale function. In a possible embodiment of the present disclosure, $\gamma$ is predetermined through experiments.

Based on the above in conjunction with FIGS. 4 and 5, in the embodiments of the present disclosure, when the first pixel group in two pixel groups includes, along the pixel row direction, a sub-pixel in the first color, two sub-pixels in the third color arranged along the pixel column direction, and a sub-pixel in the second color, and the second pixel group includes, along the pixel row direction, a sub-pixel in the second color, a sub-pixel in the first color and two sub-pixels in the third color arranged along the pixel column, the target row, i.e., the $i^{th}$ row, is the odd-numbered row. When the sub-pixels in the driving pixel unit are energized and a first dummy pixel unit in two adjacent dummy pixel units in the $i^{th}$ row is in a $j^{th}$ column, the energized sub-pixels include a sub-pixel in the second color (R) in the $i^{th}$ row and a $(j+1)^{th}$ column, a sub-pixel in the first color (B) in the $i^{th}$ row and the $j^{th}$ column, a sub-pixel in the third color (G) in an $(i-1)^{th}$ row and a $(j-1)^{th}$ column, and a sub-pixel in the third color in the $i^{th}$ row and the $j^{th}$ column. When a second dummy pixel unit is in the $i^{th}$ row and the $j^{th}$ column, the energized sub-pixels include a sub-pixel in the second color in the $i^{th}$ row and the $(j+1)^{th}$ column, a sub-pixel in the first color in an $(i+1)^{th}$ row and the $(j+1)^{th}$ column, a sub-pixel in the third color in the $(i-1)^{th}$ row and the $(j-1)^{th}$ column, and a sub-pixel in the third color in the $i^{th}$ row and the $j^{th}$ column.

When the row scanning signal is inputted to the odd-numbered row, the first driving pixel unit 201 and the second driving pixel unit 202 to which the data signal is inputted share the green sub-pixel. When the row scanning signal is inputted to the even-numbered row, the first driving pixel unit 201 and the second driving pixel unit 202 to which the data signal is inputted share the blue sub-pixel. Hence, an intermediate dummy pixel is added as compared with a common physical pixel. In this regard, two pixel groups visually become four pixel groups, i.e., a resolution is 2 times of that of a conventional display panel. As a result, it is able to increase the resolution at the second display region corresponding to the camera, and reduce a difference between a display effect at the second display region and a display effect at the first display region.

Based on the above structure, in order to increase an aperture ratio at the second display region, the quantity of physical pixels at the second display region is reduced to one fourth of the quantity of pixels in the related art.

To increase the aperture ratio at the second display region, a density of the physical pixels at the second display region is one quarter of a density of the pixels at the first display region. For example, when the density of the pixel units of a conventional OLED display panel is 720p (a dummy resolution is 1080P through the SPR driving algorithm), i.e., when the density of the dummy pixel units is 720p, the density of the physical pixels at the second display region is 720/4=180p. Through the SPR driving algorithm, the resolution is increased to twice the original resolution, so the dummy resolution viewed at the display region corresponding to the camera is 360p.

Hence, according to the display panel in the embodiments of the present disclosure, it is able to provide the display effect at the second display region approaching to that at a normal display region while ensuring a maximum light transmittance at the display region, thereby to reduce a difference between the display effect at the normal display region and the display effect at the display region corresponding to the camera.

Figure 6:
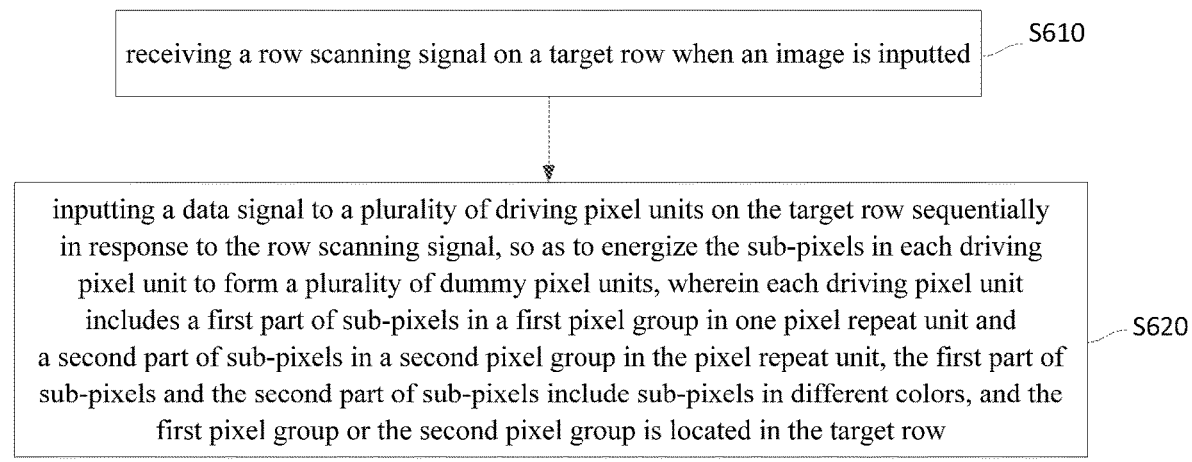
FIG. 6 is a flow chart of a display driving method according to one embodiment of the present disclosure.

The present disclosure further provides in some embodiments a display device, the display device includes the above-mentioned display panel, Based on the above description, a person skilled in the art may know the specific structure of the display device including the display panel, which will thus not be particularly defined herein The present disclosure further provides in some embodiments a display driving method for the above-mentioned display panel which, as shown in FIG. 6, includes: S610 of receiving a row scanning signal on a target row when an image is inputted; and S620 of inputting a data signal to a plurality of driving pixel units on the target row sequentially in response to the row scanning signal, so as to energize the sub-pixels in each driving pixel unit to form a plurality of dummy pixel units. Each driving pixel unit includes a first part of sub-pixels in a first pixel group in one pixel repeat unit and a second part of sub-pixels in a second pixel group in the pixel repeat unit, the first part of sub-pixels and the second part of sub-pixels include sub-pixels in different colors, and the first pixel group or the second pixel group is located in the target row.

In a possible embodiment of the present disclosure, in the plurality of driving pixel units to which the data signal is inputted, the sub-pixels in every two adjacent pixel driving units are located in a same pixel repeat unit.

In a possible embodiment of the present disclosure, when the first pixel group in the two pixel groups includes, in a pixel row direction, a sub-pixel in a first color, two sub-pixels in a third colors arranged in a pixel column direction, and a sub-pixel in a second color, and the second pixel group includes, in the pixel row direction, a sub-pixel in the second color, a sub-pixel in the first color and two sub-pixels in the third color arranged in the pixel column direction, the target row i is an odd-numbered row. When the sub-pixels in the driving pixel unit are energized and a first dummy pixel unit in two adjacent dummy pixel units in an $i^{th}$ row is in a $j^{th}$ column, the energized sub-pixels include a sub-pixel in the second color in the $i^{th}$ row and a $(j+1)^{th}$ column, a sub-pixel in the first color in the $i^{th}$ row and the $j^{th}$ column, a sub-pixel in the third color in an $(i-1)^{th}$ row and a $(j-1)^{th}$ column, and a sub-pixel in the third color in the $i^{th}$ row and the $j^{th}$ column. When a second dummy pixel unit is in the $i^{th}$ row and the $j^{th}$ column, the energized sub-pixels include a sub-pixel in the second color in the $i^{th}$ row and the $(j+1)^{th}$ column, a sub-pixel in the first color in an $(i+1)^{th}$ row and the $(j+1)^{th}$ column, a sub-pixel in the third color in the $(i-1)^{th}$ row and the $(j-1)^{th}$ column, and a sub-pixel in the third color in the $i^{th}$ row and the $j^{th}$ column.

In a possible embodiment of the present disclosure, when the target row i is an even-numbered row, the sub-pixels in the driving pixel unit are energized, and the first dummy pixel unit in the two adjacent dummy pixel units in the $i^{th}$ row is in the $j^{th}$ column, the energized sub-pixels include a sub-pixel in the second color in the $i^{th}$ row and the $j^{th}$ column, a sub-pixel in the first color in the $i^{th}$ row and the $j^{th}$ column, a sub-pixel in the third color in an $(i-_2)^{th}$ row and the $j^{th}$ column, and a sub-pixel in the third color in the $(i-1)^{th}$ row and the $j^{th}$ column. When the second dummy pixel unit is in the $i^{th}$ row and the $j^{th}$ column, the energized sub-pixels include a sub-pixel in the second color in the $i^{th}$ row and the $j^{th}$ column, a sub-pixel in the first color in the $(i+1)^{th}$ row and the $(j-1)^{th}$ column, a sub-pixel in the third color in the $i^{th}$ row and the $(j+1)^{th}$ column, and a sub-pixel in the third color in the $(i+1)^{th}$ row and the $(j+1)^{th}$ column.

Figure 7:
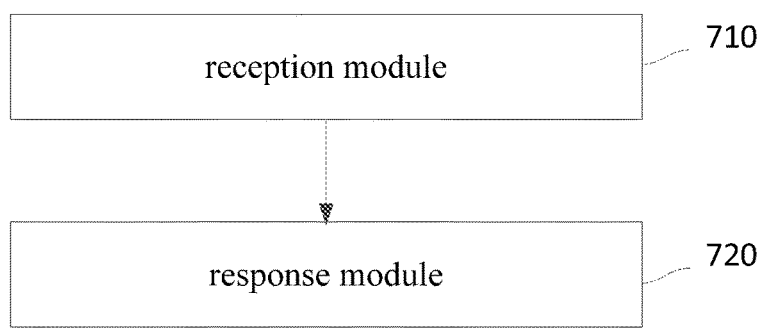
FIG. 7 is a schematic view showing a display driving device according to one embodiment of the present disclosure.

The present disclosure further provides in some embodiments a display driving device for the above-mentioned display panel which, as shown in FIG. 7, includes: a reception module 710 configured to receive a row scanning signal on a target row when an image is inputted; and a response module 720 configured to input a data signal to a plurality of driving pixel units on the target row sequentially in response to the row scanning signal, so as to energize the sub-pixels in each driving pixel unit to form a plurality of dummy pixel units. Each driving pixel unit includes a first part of sub-pixels in a first pixel group in one pixel repeat unit and a second part of sub-pixels in a second pixel group in the pixel repeat unit, the first part of sub-pixels and the second part of sub-pixels include sub-pixels in different colors, and the first pixel group or the second pixel group is located in the target row.

In a possible embodiment of the present disclosure, when the first pixel group in the two pixel groups includes, in a pixel row direction, a sub-pixel in a first color, two sub-pixels in a third colors arranged in a pixel column direction, and a sub-pixel in a second color, and the second pixel group includes, in the pixel row direction, a sub-pixel in the second color, a sub-pixel in the first color and two sub-pixels in the third color arranged in the pixel column direction, the target row i is an odd-numbered row. When the sub-pixels in the driving pixel unit are energized and a first dummy pixel unit in two adjacent dummy pixel units in an $i^{th}$ row is in a $j^{th}$ column, the energized sub-pixels include a sub-pixel in the second color in the $i^{th}$ row and a $(j+1)^{th}$ column, a sub-pixel in the first color in the $i^{th}$ row and the $j^{th}$ column, a sub-pixel in the third color in an $(i-1)^{th}$ row and a $(j-_1)^{th}$ column, and a sub-pixel in the third color in the $i^{th}$ row and the $j^{th}$ column. When a second dummy pixel unit is in the $i^{th}$ row and the $j^{th}$ column, the energized sub-pixels include a sub-pixel in the second color in the $i^{th}$ row and the $(j+1)^{th}$ column, a sub-pixel in the first color in an $(i+1)^{th}$ row and the $(j+1)^{th}$ column, a sub-pixel in the third color in the $(i-1)^{th}$ row and the $(j-1)^{th}$ column, and a sub-pixel in the third color in the $i^{th}$ row and the $j^{t}$ column.

In a possible embodiment of the present disclosure, when the target row i is an even-numbered row, the sub-pixels in the driving pixel unit are energized, and the first dummy pixel unit in the two adjacent dummy pixel units in the $i^{th}$ row is in the $j^{th}$ column, the energized sub-pixels include a sub-pixel in the second color in the $i^{th}$ row and the $j^{th}$ column, a sub-pixel in the first color in the $i^{th}$ row and the $j^{th}$ column, a sub-pixel in the third color in an $(i-_2)^{th}$ row and the $j^{th}$ column, and a sub-pixel in the third color in the $(i-1)^{th}$ row and the $j^{th}$ column. When the second dummy pixel unit is in the $i^{th}$ row and the $j^{th}$ column, the energized sub-pixels include a sub-pixel in the second color in the $i^{th}$ row and the $j^{th}$ column, a sub-pixel in the first color in the $(i+1)^{th}$ row and the $(j-_1)^{th}$ column, a sub-pixel in the third color in the $i^{th}$ row and the $(j+_1)^{th}$ column, and a sub-pixel in the third color in the $(i+1)^{th}$ row and the $(j+1)^{th}$ column.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display driving method for a display panel, the display panel comprises: a first display region and a second display region, wherein the first display region is provided with a first pixel density, and the second display region is provided with a second pixel density smaller than the first pixel density;
   each of the first display region and the second display region comprises a plurality of pixel repeat units, the plurality of pixel repeat units of the first display region and the plurality of pixel repeat units of the second display region are completely identical, each pixel repeat unit comprises two pixel groups in adjacent pixel rows, and the two pixel groups in a same pixel repeat unit are closest to each other relative to two pixel groups in different pixel repeat units; and
   each pixel group comprises a plurality of sub-pixels in three colors, the sub-pixels in three colors are arranged in different modes along a pixel row direction in the two pixel groups in a same pixel repeat unit, a sub-pixel in a first color and a sub-pixel in a third color in a first pixel group are adjacent to a sub-pixel in a second color in a second pixel group, and a sub-pixel in the first color and a sub-pixel in the second color in the second pixel group are adjacent to a sub-pixel in the third color in the first pixel group;
   wherein the display driving method comprises:
   receiving a row scanning signal on a target row when an image is inputted; and
   inputting a data signal to a plurality of driving pixel units on the target row sequentially in response to the row scanning signal, so as to energize the sub-pixels in each driving pixel unit to form a plurality of dummy pixel units,
   wherein each driving pixel unit comprises a first part of sub-pixels in a first pixel group in one pixel repeat unit and a second part of sub-pixels in a second pixel group in the pixel repeat unit, the first part of sub-pixels and the second part of sub-pixels comprise sub-pixels in different colors, and the first pixel group or the second pixel group is located in the target row;
   wherein when the first pixel group in the two pixel groups comprises, in a pixel row direction, a sub-pixel in a first color, two sub-pixels in a third colors arranged in a pixel column direction, and a sub-pixel in a second color, and the second pixel group comprises, in the pixel row direction, a sub-pixel in the second color, a sub-pixel in the first color and two sub-pixels in the third color arranged in the pixel column direction, the target row i is an odd-numbered row;
   when the sub-pixels in the driving pixel unit are energized and a first dummy pixel unit in two adjacent dummy pixel units in an ith row is in a jth column, the energized sub-pixels comprise a sub-pixel in the second color in the ith row and a (j+1)th column, a sub-pixel in the first color in the ith row and the jth column, a sub-pixel in the third color in an (i−1)th row and a (i−1) th column, and a sub-pixel in the third color in the ith row and the jth column; and
   when a second dummy pixel unit is in the ith row and the jth column, the energized sub-pixels comprise a sub-pixel in the second color in the ith row and the (j+1)th column, a sub-pixel in the first color in an (i+1)th row and the (j+1)th column, a sub-pixel in the third color in the (i−1)th row and the (j−1)th column, and a sub-pixel in the third color in the ith row and the jth column.

2. The display driving method according to claim 1, wherein in the plurality of driving pixel units to which the data signal is inputted, the sub-pixels in every two adjacent pixel driving units are located in a same pixel repeat unit.

3. The display driving method according to claim 1, wherein when the target row i is an even-numbered row, the sub-pixels in the driving pixel unit are energized, and the first dummy pixel unit in the two adjacent dummy pixel units in the ith row is in the jth column, the energized sub-pixels comprise a sub-pixel in the second color in the ith row and the jth column, a sub-pixel in the first color in the ith row and the jth column, a sub-pixel in the third color in an (i−2)th row and the jth column, and a sub-pixel in the third color in the (i−1)th row and the jth column; and when the second dummy pixel unit is in the ith row and the jth column, the energized sub-pixels comprise a sub-pixel in the second color in the ith row and the jth column, a sub-pixel in the first color in the (i+1)th row and the (j−1)th column, a sub-pixel in the third color in the ith row and the (j+1)th column, and a sub-pixel in the third color in the (i+1)th row and the (j+1)th column.

4. A display panel, configured to perform the display driving method according to claim 1, wherein the display panel comprises a first display region and a second display region, wherein the first display region is provided with a first pixel density, and the second display region is provided with a second pixel density smaller than the first pixel density;

each of the first display region and the second display region comprises a plurality of pixel repeat units, the plurality of pixel repeat units of the first display region and the plurality of pixel repeat units of the second display region are completely identical, each pixel repeat unit comprises two pixel groups in adjacent pixel rows, and the two pixel groups in a same pixel repeat unit are closest to each other relative to two pixel groups in different pixel repeat units; and each pixel group comprises a plurality of sub-pixels in three colors, the sub-pixels in three colors are arranged in different modes along a pixel row direction in the two pixel groups in a same pixel repeat unit, a sub-pixel in a first color and a sub-pixel in a third color in a first pixel group are adjacent to a sub-pixel in a second color in a second pixel group, and a sub-pixel in the first color and a sub-pixel in the second color in the second pixel group are adjacent to a sub-pixel in the third color in the first pixel group.

5. The display panel according to claim 4, wherein a second pixel group in the two pixel groups is offset by a half of a width of one sub-pixel in a first direction relative to a first pixel group, and the first direction points toward one edge of a pixel row.

6. The display panel according to claim 4, wherein the sub-pixels have a same width in the pixel row direction, a sub-pixel in the first color in a second pixel group in the two pixel groups is offset by 1.5 times of a width of one sub-pixel in a first direction relative to a sub-pixel in the first color in a first pixel group, and the first direction points toward one edge of a pixel row.

7. The display panel according to claim 6, wherein the sub-pixel in the second color in the second pixel group in the two pixel groups is offset by 1.5 times of the width of one sub-pixel in a second direction relative to a sub-pixel in the second color in the first pixel group, and the second direction points toward the other edge of the pixel row.

8. The display panel according to claim 4, wherein each pixel group comprises, in the pixel row direction, a sub-pixel in the first color, a sub-pixel in the second color and two sub-pixels in the third color, a total light-emission area of the sub-pixels in the third color is equal to a light-emission area of the sub-pixel in the first color, and the light-emission area of the sub-pixel in the first color is equal to a light-emission area of the sub-pixel in the second color.

9. The display panel according to claim 4, wherein a first pixel group in the two pixel groups comprises, in the pixel row direction, a sub-pixel in the first color, two second sub-pixels in the third color arranged in a pixel column direction, and a sub-pixel in the second color, and a second pixel group comprises, in the pixel row direction, a sub-pixel in the second color, a sub-pixel in the first color and two sub-pixels in the third color arranged in the pixel column direction.

10. The display panel according to claim 8, wherein a first pixel group in the two pixel groups comprises, in the pixel row direction, a sub-pixel in the first color, two second sub-pixels in the third color arranged in a pixel column direction, and a sub-pixel in the second color, and a second pixel group comprises, in the pixel row direction, a sub-pixel in the second color, a sub-pixel in the first color and two sub-pixels in the third color arranged in the pixel column direction.

11. The display panel according to claim 4, wherein each pixel repeat unit is spaced part from an adjacent pixel repeat unit by a space for accommodating at least one pixel repeat unit in both the pixel row direction and the pixel column direction at the second display region.

12. The display panel according to claim 9, wherein the first color is blue, the second color is red, and the third color is green.

13. A display device, comprising the display panel according to claim 4.

14. The display device according to claim 13, wherein a second pixel group in the two pixel groups is offset by a half of a width of one sub-pixel in a first direction relative to a first pixel group, and the first direction points toward one edge of a pixel row.

15. The display device according to claim 13, wherein the sub-pixels have a same width in the pixel row direction, a sub-pixel in the first color in a second pixel group in the two pixel groups is offset by 1.5 times of a width of one sub-pixel in a first direction relative to a sub-pixel in the first color in a first pixel group, and the first direction points toward one edge of a pixel row.

16. The display device according to claim 15, wherein the sub-pixel in the second color in the second pixel group in the two pixel groups is offset by 1.5 times of the width of one sub-pixel in a second direction relative to a sub-pixel in the second color in the first pixel group, and the second direction points toward the other edge of the pixel row.

17. The display device according to claim 13, wherein each pixel group comprises, in the pixel row direction, a sub-pixel in the first color, a sub-pixel in the second color and two sub-pixels in the third color, a total light-emission area of the sub-pixels in the third color is equal to a light-emission area of the sub-pixel in the first color, and the light-emission area of the sub-pixel in the first color is equal to a light-emission area of the sub-pixel in the second color.

18. The display device according to claim 13, wherein a first pixel group in the two pixel groups comprises, in the pixel row direction, a sub-pixel in the first color, two second sub-pixels in the third color arranged in a pixel column direction, and a sub-pixel in the second color, and a second pixel group comprises, in the pixel row direction, a sub-pixel in the second color, a sub-pixel in the first color and two sub-pixels in the third color arranged in the pixel column direction.

* * * * *